US010861736B2

(12) United States Patent
Gangakhedkar et al.

(10) Patent No.: US 10,861,736 B2
(45) Date of Patent: Dec. 8, 2020

(54) APPARATUS AND METHODS FOR WAFER ROTATION IN CAROUSEL SUSCEPTOR

(71) Applicant: Applied Materials, Inc., Santa Clara, CA (US)

(72) Inventors: Kaushal Gangakhedkar, San Jose, CA (US); Joseph Yudovsky, Campbell, CA (US)

(73) Assignee: Applied Materials, Inc., Santa Clara, CA (US)

(*) Notice: Subject to any disclaimer, the term of this patent is extended or adjusted under 35 U.S.C. 154(b) by 18 days.

(21) Appl. No.: 16/285,401

(22) Filed: Feb. 26, 2019

(65) Prior Publication Data

US 2019/0189498 A1 Jun. 20, 2019

Related U.S. Application Data

(62) Division of application No. 15/474,439, filed on Mar. 30, 2017, now Pat. No. 10,262,888.

(60) Provisional application No. 62/317,531, filed on Apr. 2, 2016.

(51) Int. Cl.
*H01L 21/687* (2006.01)
*C23C 16/455* (2006.01)
*C23C 16/458* (2006.01)

(52) U.S. Cl.
CPC .... *H01L 21/68742* (2013.01); *C23C 16/4584* (2013.01); *C23C 16/45544* (2013.01); *C23C 16/45551* (2013.01); *H01L 21/68764* (2013.01); *H01L 21/68771* (2013.01); *H01L 21/68785* (2013.01)

(58) Field of Classification Search
CPC ................................. H01L 21/68742
See application file for complete search history.

(56) References Cited

U.S. PATENT DOCUMENTS

| 5,338,362 A | 8/1994 | Imahashi |
| 5,747,113 A | 5/1998 | Tsai |
| 6,576,062 B2 | 6/2003 | Matsuse |

(Continued)

FOREIGN PATENT DOCUMENTS

| JP | S58181714 A | 10/1983 |
| WO | 2008/100846 A2 | 8/2008 |

OTHER PUBLICATIONS

PCT International Preliminary Report on Patentability in PCT/US2017/025041 dated Oct. 11, 2018, 8 pages.

(Continued)

*Primary Examiner* — Joseph A Miller, Jr.
(74) *Attorney, Agent, or Firm* — Servilla Whitney LLC

(57) ABSTRACT

Apparatus and method for processing a plurality of substrates in a batch processing chamber are described. The apparatus comprises a susceptor assembly, a lift assembly and a rotation assembly. The susceptor assembly has a top surface and a bottom surface with a plurality of recesses in the top surface. Each of the recesses has a lift pocket in the recess bottom. The lift assembly including a lift plate having a top surface to contact the substrate. The lift plate is connected to a lift shaft that extends through the susceptor assembly and connects to a lift friction pad. The rotation assembly has a rotation friction pad that contacts the lift friction pad. The rotation friction pad is connected to a rotation shaft and can be vertically aligned with the lift friction pad.

16 Claims, 11 Drawing Sheets

(56) References Cited

U.S. PATENT DOCUMENTS

| | | |
|---|---|---|
| 8,043,432 B2 | 10/2011 | Dip |
| 2001/0007244 A1 | 7/2001 | Matsuse |
| 2003/0029384 A1 | 2/2003 | Nishikawa |
| 2003/0075109 A1 | 4/2003 | Arai |
| 2008/0124207 A1* | 5/2008 | Shimai .............. H01L 21/68742 414/781 |
| 2009/0143911 A1 | 6/2009 | Gage et al. |
| 2010/0132742 A1 | 6/2010 | Tomita et al. |
| 2010/0136795 A1 | 6/2010 | Honma |
| 2010/0186669 A1 | 7/2010 | Shin et al. |
| 2011/0114014 A1 | 5/2011 | Sakurai et al. |
| 2011/0159702 A1 | 6/2011 | Ohizumi et al. |
| 2011/0290175 A1 | 12/2011 | Paranjpe et al. |
| 2013/0139753 A1 | 6/2013 | Kang et al. |
| 2014/0216332 A1 | 8/2014 | Omori et al. |
| 2016/0177450 A1* | 6/2016 | Kanno .............. H01L 21/67248 427/535 |

OTHER PUBLICATIONS

PCT International Search Report and Written Opinion in PCT/US2017/025041 dated Jul. 13, 2017, 11 pages.

* cited by examiner

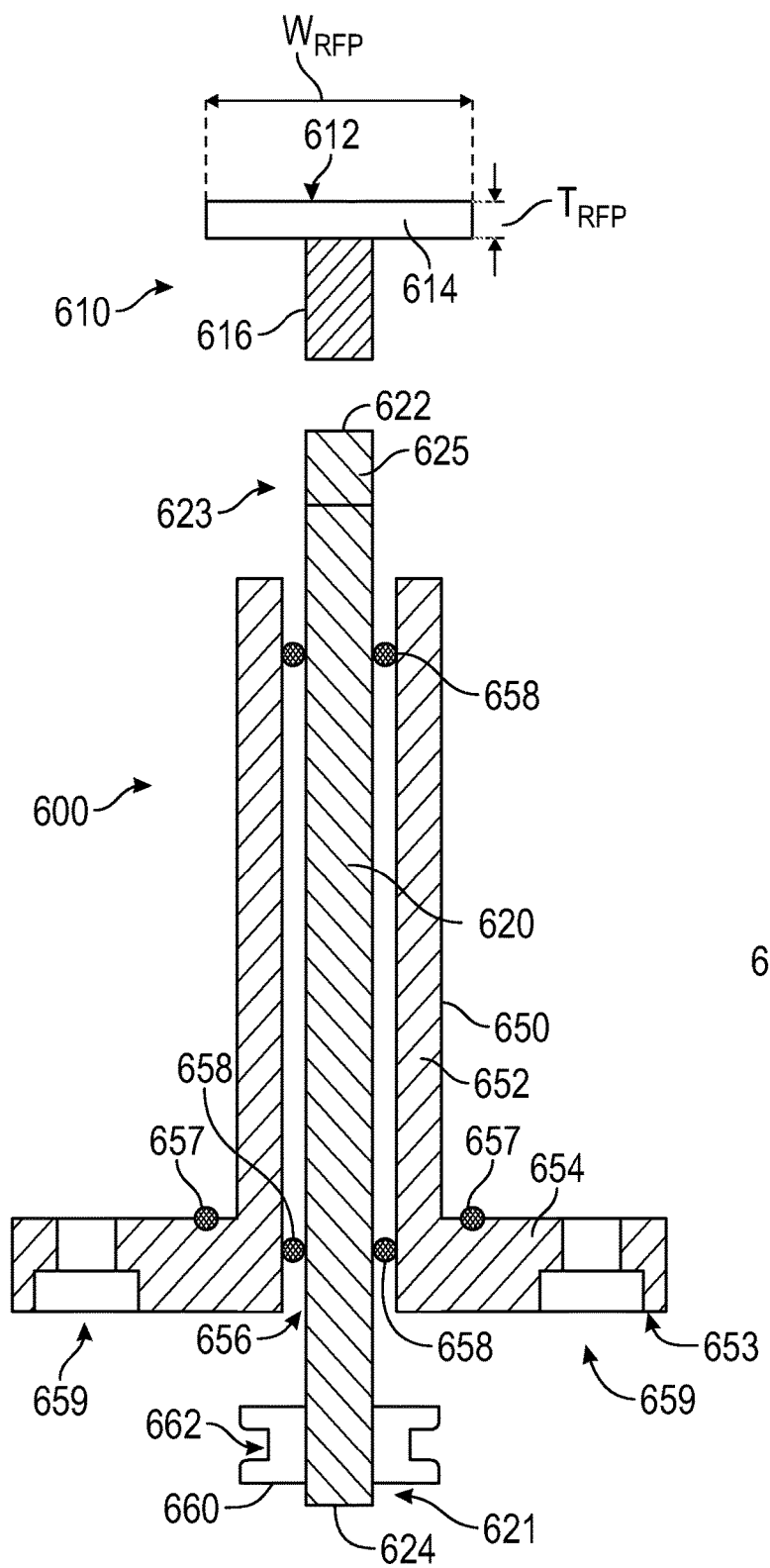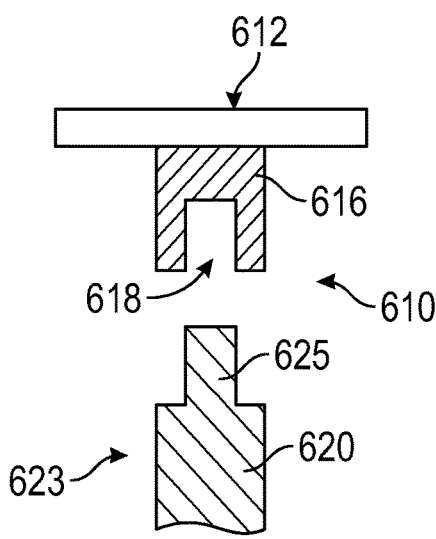
FIG. 11
FIG. 10

APPARATUS AND METHODS FOR WAFER ROTATION IN CAROUSEL SUSCEPTOR

CROSS-REFERENCE TO RELATED APPLICATIONS

This application is a divisional of U.S. patent application Ser. No. 15/474,439 filed on Mar. 30, 2017, which claims priority to U.S. Provisional Application No. 62/317,531, filed Apr. 2, 2016, the entire disclosures of which are hereby incorporated by reference herein.

TECHNICAL FIELD

The present disclosure relates generally to apparatus and methods for processing one or more substrates in a processing chamber. In particular, the disclosure relates to methods of increasing the process uniformity in a batch processing chamber.

BACKGROUND

Semiconductor device formation is commonly conducted in substrate processing systems or platforms containing multiple chambers, which may also be referred to as cluster tools. In some instances, the purpose of a multi-chamber processing platform or cluster tool is to perform two or more processes on a substrate sequentially in a controlled environment. In other instances, however, a multiple chamber processing platform may only perform a single processing step on substrates. The additional chambers can be employed to maximize the rate at which substrates are processed. In the latter case, the process performed on substrates is typically a batch process, wherein a relatively large number of substrates, e.g. 25 or 50, are processed in a given chamber simultaneously. Batch processing is especially beneficial for processes that are too time-consuming to be performed on individual substrates in an economically viable manner, such as for atomic layer deposition (ALD) processes and some chemical vapor deposition (CVD) processes.

Many high temperature CVD/ALD chambers have smaller single wafer carriers which provide known film uniformity upon deposition. Providing thermal and film uniformity in a large carousel-type batch processing chamber which uses a multi-wafer carousel susceptor rotating about a center pedestal driven by a dual-axis motor is more challenging because the wafers are off-axis relative to the rotation of the susceptor. Thermal and film thickness maps indicate the presence of hot spot handles (arcs) at 4 and 8 o'clock positions an cold spots at other places around the wafer edge. Accordingly, there is a need in the art for improved apparatus and methods to deposit uniform films in batch processing chambers.

SUMMARY

One or more embodiments of the disclosure are directed to apparatus comprising a susceptor assembly, a lift assembly and a rotation assembly. The susceptor assembly has a top surface and a bottom surface defining a thickness. The susceptor assembly includes a plurality of recesses in the top surface. Each of the recesses has a recess bottom spaced a distance from the top surface of the susceptor assembly. Each of the recesses has a lift pocket with a lift pocket bottom surface spaced a distance from the recess bottom defining a depth of the lift pocket. The lift assembly includes a lift plate having a top surface and bottom surface defining a thickness. A lift shaft extends from the lift plate in a direction opposite the top surface. A lift friction pad with a bottom surface is at an end of the lift shaft. The lift plate is positioned within the lift pocket and the lift shaft is positioned within an opening in the susceptor and extending a distance from the bottom of the susceptor. The rotation assembly comprises a rotation friction pad with a top surface and a rotation shaft extending from the rotation friction pad. The top surface of the rotation friction pad is in vertical alignment with the bottom surface of the lift friction pad.

Additional embodiments of the disclosure are directed to apparatus comprising a processing chamber including a bottom, top and sidewall defining a processing region within. A susceptor assembly is inside the processing chamber and has a top surface and a bottom surface defining a thickness. The susceptor assembly includes a plurality of recesses in the top surface. Each of the recesses has a recess bottom spaced a distance from the top surface of the susceptor assembly. Each of the recesses has a lift pocket substantially centered within the recess and each lift pocket has a lift pocket bottom surface spaced a distance from the recess bottom defining a depth of the lift pocket. A lift assembly is positioned within each of the plurality of recesses. The lift assemblies include a lift plate having a top surface and bottom surface defining a thickness within ±2 mm of the depth of the lift pocket. A lift shaft extends from the bottom surface of the lift plate. The lift shaft has a length sufficient to pass through the susceptor and extend the lift plate above the recess bottom by a distance greater than or equal to about 1 mm. The lift assembly includes a lift friction pad with a bottom surface at an end of the lift shaft. The lift plate is positioned within the lift pocket and the lift shaft is positioned within an opening in the susceptor and extending a distance from the bottom of the susceptor. A plurality of rotation assemblies comprising a rotation friction pad with a top surface. The rotation assembly includes a rotation shaft extending from the rotation friction pad. The top surface of the rotation friction pad is in vertical alignment with the bottom surface of the lift friction pad. The rotation assembly further includes a flange with an opening sized to allow the rotation shaft to pass through and a bottom surface with a plurality of bolt holes therethrough. The flange is positioned adjacent to and connected to the bottom of the processing chamber outside of the processing region. A pulley is connected to the rotation shaft of each of the rotation assemblies. A rotation motor has a belt sized to contact the pulley on each of the rotation assemblies so that all of the rotation assemblies are rotated at the same time.

Further embodiments of the disclosure are directed to processing methods. A plurality of substrates is positioned on a susceptor assembly inside a processing chamber. Each of the substrates is positioned within a recess in a top surface of the susceptor assembly. At least some of the substrates are exposed to a flow of reactive gas from a gas distribution assembly positioned above and spaced from the top surface of the susceptor assembly. The susceptor assembly is rotated while exposing at least some of the substrates to the flow of reactive gas. The rotation of the susceptor assembly is stopped. The substrates are raised by lowering the susceptor assembly until a lift assembly within the recess contacts a rotation assembly below the susceptor assembly and causes the substrate to be lifted from the recess. The lift assembly comprises a lift plate connected to a lift shaft extending through the susceptor assembly and a lift friction pad below the susceptor assembly. The rotation assembly comprises a rotation friction pad to contact the lift friction pad. A rotation shaft is connected to the rotation friction pad and extends through a bottom of the processing chamber. The substrates are rotated by turning the rotation shaft with a rotation motor. The rotation motor is connected to a pulley on the rotation shaft with a belt. The rotation motor rotates the rotation friction pad which is in contact with the lift friction pad causing rotation of the lift friction pad. The lift shaft and the lift plate are in contact with the substrate causing rotation of the substrate. The substrates are lowered into the recess by raising the susceptor assembly to disengage the lift assembly from the rotation assembly.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 10 shows a schematic front view of a rotation assembly in accordance with one or more embodiment of the disclosure;

FIG. 11 shows a partial schematic side view of the rotation assembly of FIG. 10;

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface.

Figure 1:
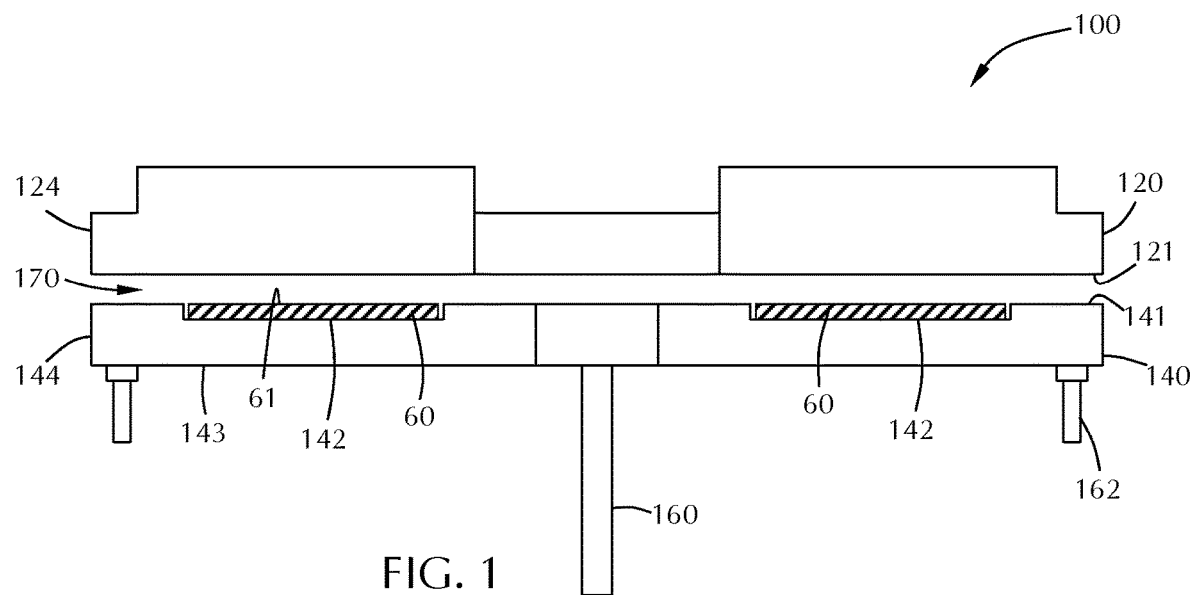
FIG. 1 shows a cross-sectional view of a batch processing chamber in accordance with one or more embodiment of the disclosure.

FIG. 1 shows a cross-section of a processing chamber 100 including a gas distribution assembly 120, also referred to as injectors or an injector assembly, and a susceptor assembly 140. The gas distribution assembly 120 is any type of gas delivery device used in a processing chamber. The gas distribution assembly 120 includes a front surface 121 which faces the susceptor assembly 140. The front surface 121 can have any number or variety of openings to deliver a flow of gases toward the susceptor assembly 140. The gas distribution assembly 120 also includes an outer peripheral edge 124 which in the embodiments shown, is substantially round.

The specific type of gas distribution assembly 120 used can vary depending on the particular process being used. Embodiments of the disclosure can be used with any type of processing system where the gap between the susceptor and the gas distribution assembly is controlled. While various types of gas distribution assemblies can be employed (e.g., showerheads), embodiments of the disclosure may be particularly useful with spatial gas distribution assemblies which have a plurality of substantially parallel gas channels. As used in this specification and the appended claims, the term "substantially parallel" means that the elongate axis of the gas channels extend in the same general direction. There can be slight imperfections in the parallelism of the gas channels. In a binary reaction, the plurality of substantially parallel gas channels can include at least one first reactive gas A channel, at least one second reactive gas B channel, at least one purge gas P channel and/or at least one vacuum V channel. The gases flowing from the first reactive gas A channel(s), the second reactive gas B channel(s) and the purge gas P channel(s) are directed toward the top surface of the wafer. Some of the gas flow moves horizontally across the surface of the wafer and out of the process region through the purge gas P channel(s). A substrate moving from one end of the gas distribution assembly to the other end will be exposed to each of the process gases in turn, forming a layer on the substrate surface.

Figure 2:
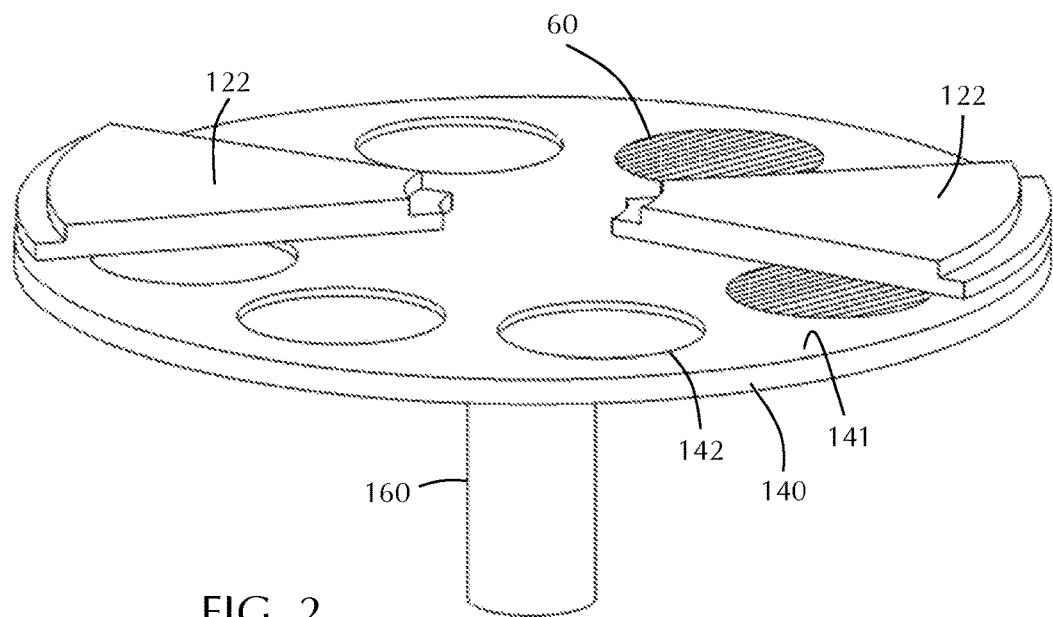
FIG. 2 shows a partial perspective view of a batch processing chamber in accordance with one or more embodiment of the disclosure.

In some embodiments, the gas distribution assembly 120 is a rigid stationary body made of a single injector unit. In one or more embodiments, the gas distribution assembly 120 is made up of a plurality of individual sectors (e.g., injector units 122), as shown in FIG. 2. Either a single piece body or a multi-sector body can be used with the various embodiments of the disclosure described.

A susceptor assembly 140 is positioned beneath the gas distribution assembly 120. The susceptor assembly 140 includes a top surface 141 and at least one recess 142 in the top surface 141. The susceptor assembly 140 also has a bottom surface 143 and an edge 144. The recess 142 can be any suitable shape and size depending on the shape and size of the substrates 60 being processed. In the embodiment shown in FIG. 1, the recess 142 has a flat bottom to support the bottom of the wafer; however, the bottom of the recess can vary. In some embodiments, the recess has step regions around the outer peripheral edge of the recess which are sized to support the outer peripheral edge of the wafer. The amount of the outer peripheral edge of the wafer that is supported by the steps can vary depending on, for example, the thickness of the wafer and the presence of features already present on the back side of the wafer.

In some embodiments, as shown in FIG. 1, the recess 142 in the top surface 141 of the susceptor assembly 140 is sized so that a substrate 60 supported in the recess 142 has a top surface 61 substantially coplanar with the top surface 141 of the susceptor 140. As used in this specification and the appended claims, the term "substantially coplanar" means that the top surface of the wafer and the top surface of the susceptor assembly are coplanar within ±0.2 mm. In some embodiments, the top surfaces are coplanar within ±0.15 mm, ±0.10 mm or ±0.05 mm.

The susceptor assembly 140 of FIG. 1 includes a support post 160 which is capable of lifting, lowering and rotating the susceptor assembly 140. The susceptor assembly may include a heater, or gas lines, or electrical components within the center of the support post 160. The support post 160 may be the primary means of increasing or decreasing the gap between the susceptor assembly 140 and the gas distribution assembly 120, moving the susceptor assembly 140 into proper position. The susceptor assembly 140 may also include fine tuning actuators 162 which can make micro-adjustments to susceptor assembly 140 to create a predetermined gap 170 between the susceptor assembly 140 and the gas distribution assembly 120.

In some embodiments, the gap 170 distance is in the range of about 0.1 mm to about 5.0 mm, or in the range of about 0.1 mm to about 3.0 mm, or in the range of about 0.1 mm to about 2.0 mm, or in the range of about 0.2 mm to about 1.8 mm, or in the range of about 0.3 mm to about 1.7 mm, or in the range of about 0.4 mm to about 1.6 mm, or in the range of about 0.5 mm to about 1.5 mm, or in the range of about 0.6 mm to about 1.4 mm, or in the range of about 0.7 mm to about 1.3 mm, or in the range of about 0.8 mm to about 1.2 mm, or in the range of about 0.9 mm to about 1.1 mm, or about 1 mm.

The processing chamber 100 shown in the Figures is a carousel-type chamber in which the susceptor assembly 140 can hold a plurality of substrates 60. As shown in FIG. 2, the gas distribution assembly 120 may include a plurality of separate injector units 122, each injector unit 122 being capable of depositing a film on the wafer, as the wafer is moved beneath the injector unit. Two pie-shaped injector units 122 are shown positioned on approximately opposite sides of and above the susceptor assembly 140. This number of injector units 122 is shown for illustrative purposes only. It will be understood that more or less injector units 122 can be included. In some embodiments, there are a sufficient number of pie-shaped injector units 122 to form a shape conforming to the shape of the susceptor assembly 140. In some embodiments, each of the individual pie-shaped injector units 122 may be independently moved, removed and/or replaced without affecting any of the other injector units 122. For example, one segment may be raised to permit a robot to access the region between the susceptor assembly 140 and gas distribution assembly 120 to load/unload substrates 60.

Figure 3:
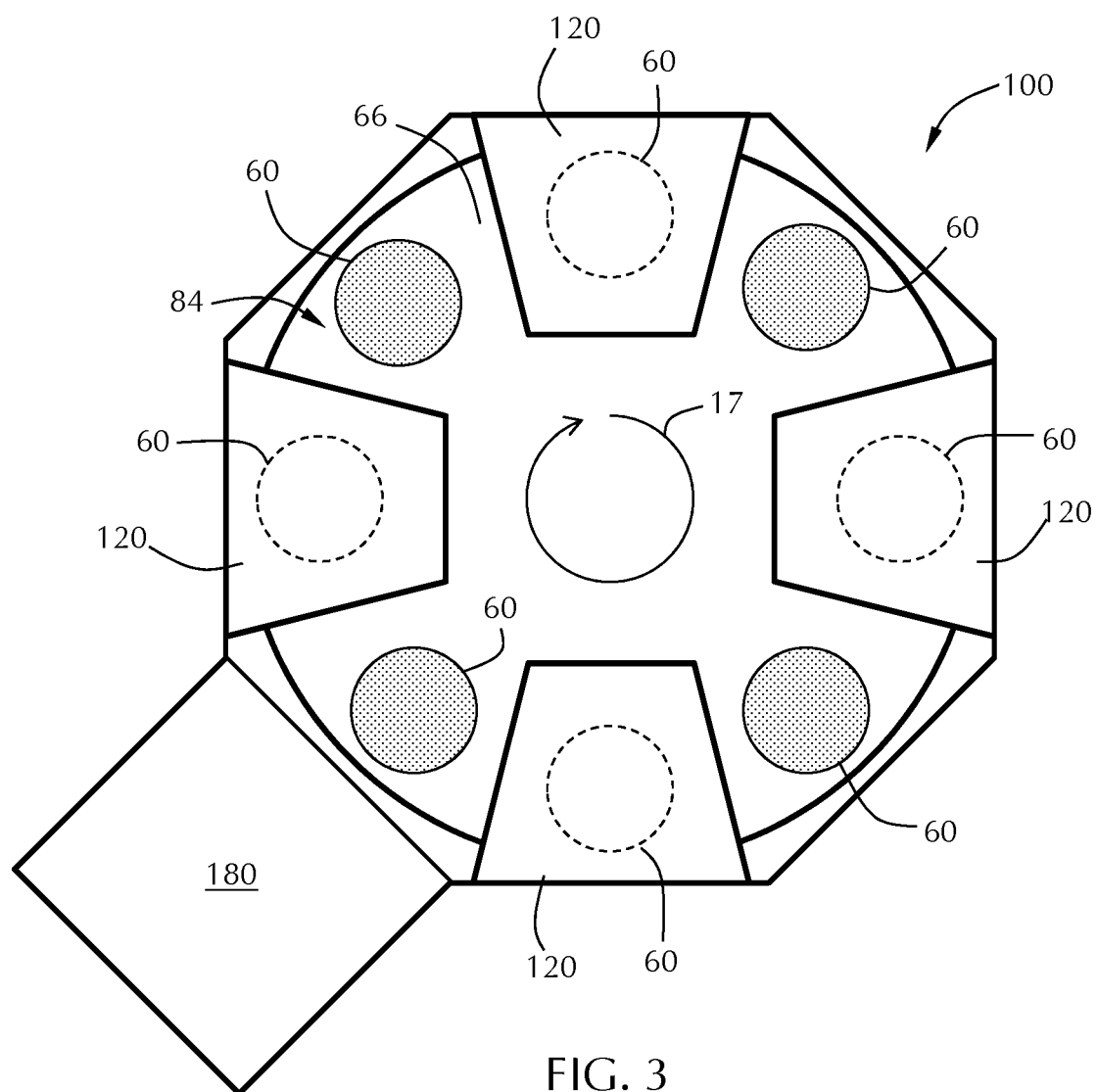
FIG. 3 shows a schematic view of a batch processing chamber in accordance with one or more embodiment of the disclosure.

Processing chambers having multiple gas injectors can be used to process multiple wafers simultaneously so that the wafers experience the same process flow. For example, as shown in FIG. 3, the processing chamber 100 has four gas injector assemblies and four substrates 60. At the outset of processing, the substrates 60 can be positioned between the gas distribution assemblies 120. Rotating 17 the susceptor assembly 140 by 45° will result in each substrate 60 which is between gas distribution assemblies 120 to be moved to a gas distribution assembly 120 for film deposition, as illustrated by the dotted circle under the gas distribution assemblies 120. An additional 45° rotation would move the substrates 60 away from the gas distribution assemblies 120. The number of substrates 60 and gas distribution assemblies 120 can be the same or different. In some embodiments, there are the same numbers of wafers being processed as there are gas distribution assemblies. In one or more embodiments, the number of wafers being processed are fraction of or an integer multiple of the number of gas distribution assemblies. For example, if there are four gas distribution assemblies, there are 4x wafers being processed, where x is an integer value greater than or equal to one. In an exemplary embodiment, the gas distribution assembly 120 includes eight process regions separated by gas curtains and the susceptor assembly 140 can hold six wafers.

The processing chamber 100 shown in FIG. 3 is merely representative of one possible configuration and should not be taken as limiting the scope of the disclosure. Here, the processing chamber 100 includes a plurality of gas distribution assemblies 120. In the embodiment shown, there are four gas distribution assemblies 120 (also called injector assemblies) evenly spaced about the processing chamber 100. The processing chamber 100 shown is octagonal; however, those skilled in the art will understand that this is one possible shape and should not be taken as limiting the scope of the disclosure. The gas distribution assemblies 120 shown are trapezoidal, but can be a single circular component or made up of a plurality of pie-shaped segments, like that shown in FIG. 2.

The embodiment shown in FIG. 3 includes a load lock chamber 180, or an auxiliary chamber like a buffer station. This load lock chamber 180 is connected to a side of the processing chamber 100 to allow, for example the substrates (also referred to as substrates 60) to be loaded/unloaded from the processing chamber 100. A wafer robot may be positioned in the load lock chamber 180 to move the substrate onto the susceptor.

Rotation of the carousel (e.g., the susceptor assembly 140) can be continuous or intermittent (discontinuous). In continuous processing, the wafers are constantly rotating so that they are exposed to each of the injectors in turn. In discontinuous processing, the wafers can be moved to the injector region and stopped, and then to the region 84 between the injectors and stopped. For example, the carousel can rotate so that the wafers move from an inter-injector region across the injector (or stop adjacent the injector) and on to the next inter-injector region where the carousel can pause again. Pausing between the injectors may provide time for additional processing steps between each layer deposition (e.g., exposure to plasma).

Figure 4:
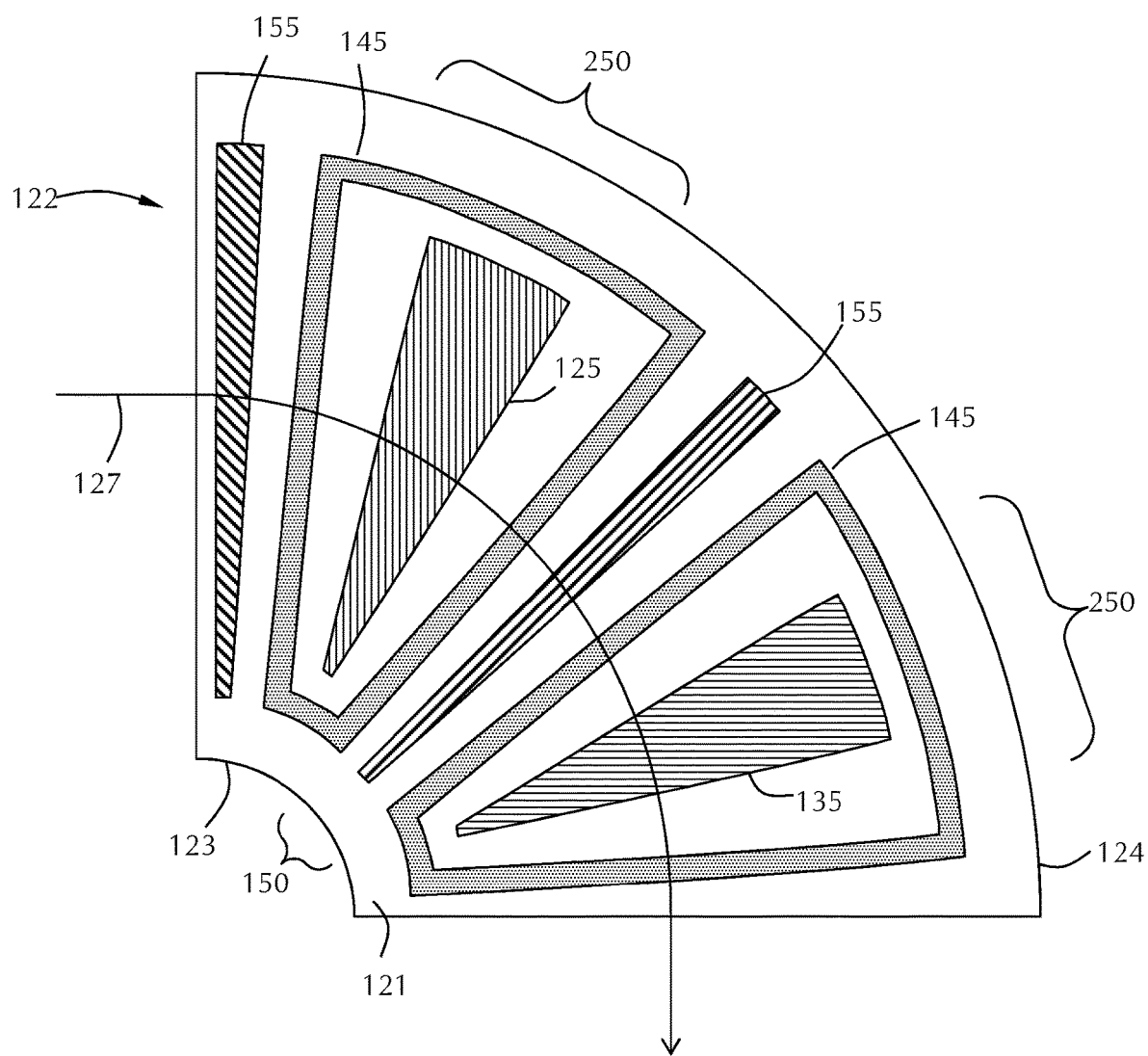
FIG. 4 shows a schematic view of a portion of a wedge shaped gas distribution assembly for use in a batch processing chamber in accordance with one or more embodiment of the disclosure.
Figure 5:
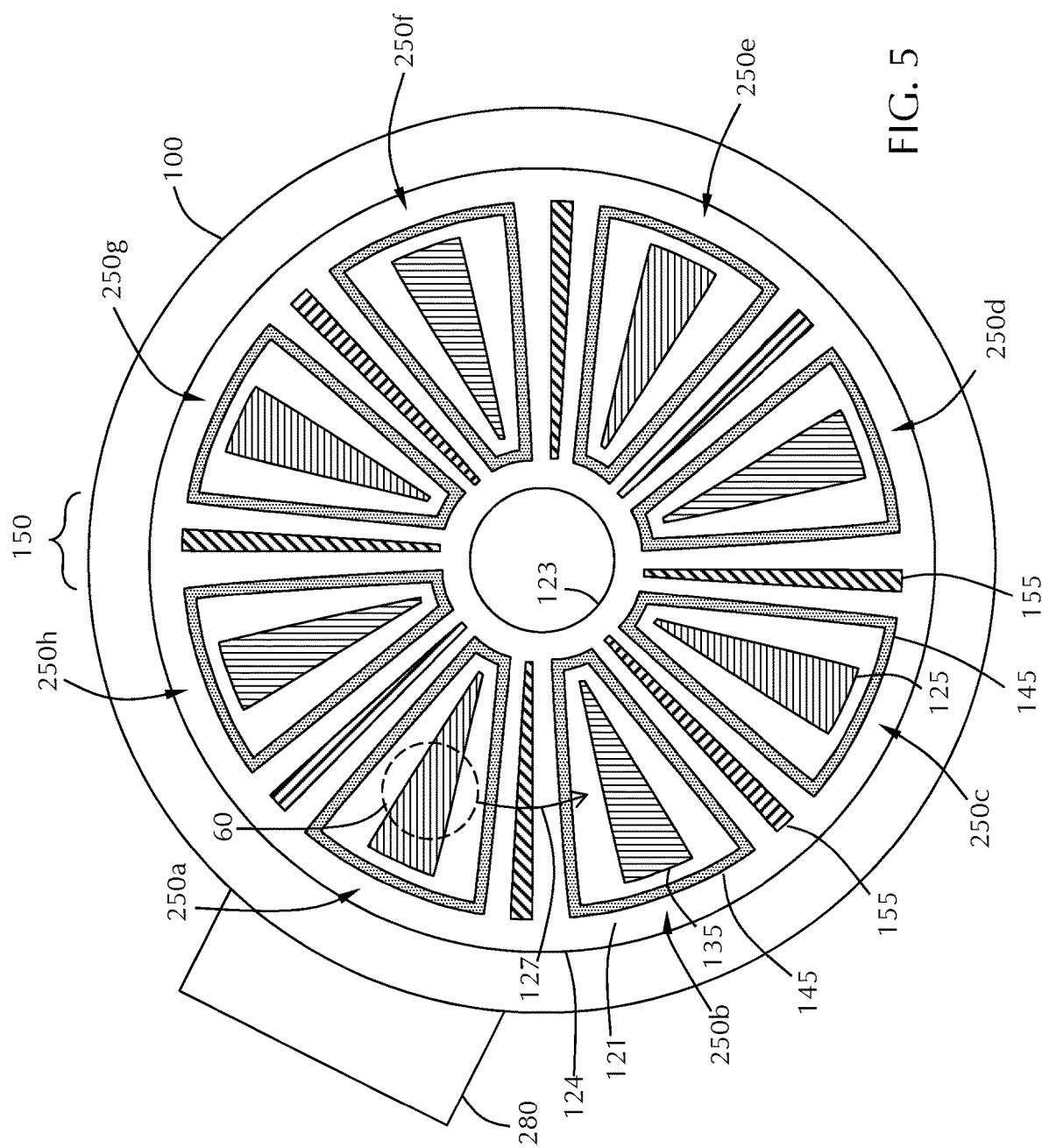
FIG. 5 shows a schematic view of a batch processing chamber in accordance with one or more embodiment of the disclosure.

FIG. 4 shows a sector or portion of a gas distribution assembly 220, which may be referred to as an injector unit 122. The injector units 122 can be used individually or in combination with other injector units. For example, as shown in FIG. 5, four of the injector units 122 of FIG. 4 are combined to form a single gas distribution assembly 220. (The lines separating the four injector units are not shown for clarity.) While the injector unit 122 of FIG. 4 has both a first reactive gas port 125 and a second gas port 135 in addition to purge gas ports 155 and vacuum ports 145, an injector unit 122 does not need all of these components.

Referring to both FIGS. 4 and 5, a gas distribution assembly 220 in accordance with one or more embodiment may comprise a plurality of sectors (or injector units 122) with each sector being identical or different. The gas distribution assembly 220 is positioned within the processing chamber and comprises a plurality of elongate gas ports 125, 135, 155 and vacuum ports 145 in a front surface 121 of the gas distribution assembly 220. The plurality of elongate gas ports 125, 135, 155 and vacuum ports 145 extend from an area adjacent the inner peripheral edge 123 toward an area adjacent the outer peripheral edge 124 of the gas distribution assembly 220. The plurality of gas ports shown include a first reactive gas port 125, a second gas port 135, a vacuum port 145 which surrounds each of the first reactive gas ports and the second reactive gas ports and a purge gas port 155.

With reference to the embodiments shown in FIG. 4 or 5, when stating that the ports extend from at least about an inner peripheral region to at least about an outer peripheral region, however, the ports can extend more than just radially from inner to outer regions. The ports can extend tangentially as vacuum port 145 surrounds reactive gas port 125 and reactive gas port 135. In the embodiment shown in FIGS. 4 and 5, the wedge shaped reactive gas ports 125, 135 are surrounded on all edges, including adjacent the inner peripheral region and outer peripheral region, by a vacuum port 145.

Referring to FIG. 4, as a substrate moves along path 127, each portion of the substrate surface is exposed to the various reactive gases. To follow the path 127, the substrate will be exposed to, or "see", a purge gas port 155, a vacuum port 145, a first reactive gas port 125, a vacuum port 145, a purge gas port 155, a vacuum port 145, a second gas port 135 and a vacuum port 145. Thus, at the end of the path 127 shown in FIG. 4, the substrate has been exposed to the first reactive gas and the second reactive gas to form a layer. The injector unit 122 shown makes a quarter circle but could be larger or smaller. The gas distribution assembly 220 shown in FIG. 5 can be considered a combination of four of the injector units 122 of FIG. 4 connected in series.

The injector unit 122 of FIG. 4 shows a gas curtain 150 that separates the reactive gases. The term "gas curtain" is used to describe any combination of gas flows or vacuum that separate reactive gases from mixing. The gas curtain 150 shown in FIG. 4 comprises the portion of the vacuum port 145 next to the first reactive gas port 125, the purge gas port 155 in the middle and a portion of the vacuum port 145 next to the second gas port 135. This combination of gas flow and vacuum can be used to prevent or minimize gas phase reactions of the first reactive gas and the second reactive gas.

Referring to FIG. 5, the combination of gas flows and vacuum from the gas distribution assembly 220 form a separation into a plurality of process regions 250. The process regions are roughly defined around the individual gas ports 125, 135 with the gas curtain 150 between 250. The embodiment shown in FIG. 5 makes up eight separate process regions 250 with eight separate gas curtains 150 between. A processing chamber can have at least two process regions. In some embodiments, there are at least three, four, five, six, seven, eight, nine, 10, 11 or 12 process regions.

During processing a substrate may be exposed to more than one process region 250 at any given time. However, the portions that are exposed to the different process regions will have a gas curtain separating the two. For example, if the leading edge of a substrate enters a process region including the second gas port 135, a middle portion of the substrate will be under a gas curtain 150 and the trailing edge of the substrate will be in a process region including the first reactive gas port 125.

A factory interface 280, which can be, for example, a load lock chamber, is shown connected to the processing chamber 100. A substrate 60 is shown superimposed over the gas distribution assembly 220 to provide a frame of reference. The substrate 60 may often sit on a susceptor assembly to be held near the front surface 121 of the gas distribution assembly 120. The substrate 60 is loaded via the factory interface 280 into the processing chamber 100 onto a substrate support or susceptor assembly (see FIG. 3). The substrate 60 can be shown positioned within a process region because the substrate is located adjacent the first reactive gas port 125 and between two gas curtains. Rotating the substrate 60 along path 127 will move the substrate counter-clockwise around the processing chamber 100. Thus, the substrate 60 will be exposed to the first process region 250a through the eighth process region 250h, including all process regions between.

Embodiments of the disclosure are directed to processing methods comprising a processing chamber 100 with a plurality of process regions 250a-250h with each process region separated from an adjacent region by a gas curtain 150. For example, the processing chamber shown in FIG. 5. The number of gas curtains and process regions within the processing chamber can be any suitable number depending on the arrangement of gas flows. The embodiment shown in FIG. 5 has eight gas curtains 150 and eight process regions 250a-250h. The number of gas curtains is generally equal to or greater than the number of process regions.

A plurality of substrates 60 are positioned on a substrate support, for example, the susceptor assembly 140 shown FIGS. 1 and 2. The plurality of substrates 60 are rotated around the process regions for processing. Generally, the gas curtains 150 are engaged (gas flowing and vacuum on) throughout processing including periods when no reactive gas is flowing into the chamber.

A first reactive gas A is flowed into one or more of the process regions 250 while an inert gas is flowed into any process region 250 which does not have a first reactive gas A flowing into it. For example if the first reactive gas is flowing into process regions 250b through process region 250h, an inert gas would be flowing into process region 250a. The inert gas can be flowed through the first reactive gas port 125 or the second gas port 135.

The inert gas flow within the process regions can be constant or varied. In some embodiments, the reactive gas is co-flowed with an inert gas. The inert gas will act as a carrier and diluent. Since the amount of reactive gas, relative to the carrier gas, is small, co-flowing may make balancing the gas pressures between the process regions easier by decreasing the differences in pressure between adjacent regions.

Some embodiments of the disclosure are directed to multiple wafer rotation/indexing apparatus and methods that can operate in tandem with susceptor rotation for in-wafer uniformity of film thickness/resistivity. Some embodiments advantageously increase the with-in wafer (WiW) film thickness. Some embodiments advantageously increase the WiW film resistivity. Some embodiments increase the wafer-to-wafer (WtW) uniformity by providing a repeatable process condition for multiple substrate processes.

Some embodiments of the disclosure use friction pads located below each recess position (below the susceptor) and synchronized with pin-lift and susceptor lift-rotation (dual axis) motors.

Figure 6:
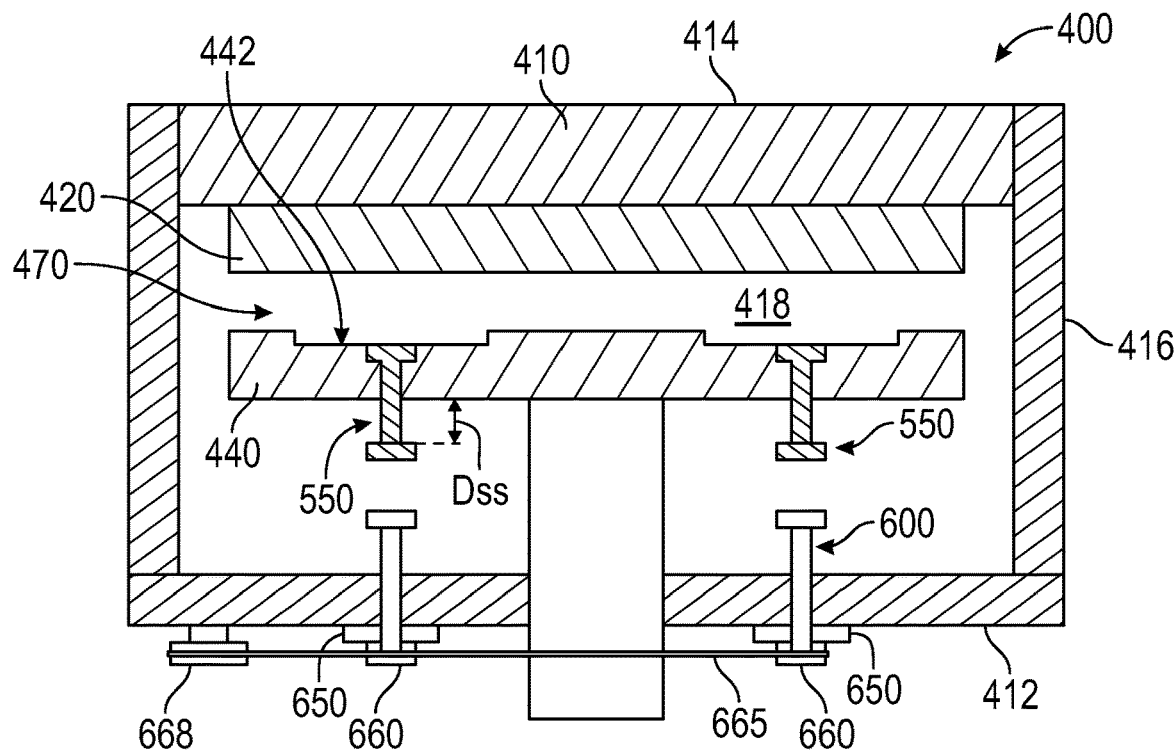
FIG. 6 shows a schematic front view of a processing chamber in accordance with one or more embodiment of the disclosure.

FIGS. 6 through 13 show various embodiments of the disclosure. Referring to FIG. 6, the apparatus 400 includes a processing chamber 410. The processing chamber 410 has a bottom 412, top 414 and sidewall 416 defining a processing region 418 within. The processing chamber 410 includes a gas distribution assembly 420 and susceptor assembly 440. The susceptor assembly 440 is spaced a distance from the gas distribution assembly 420 to form a gap 470. The spacing between the gas distribution assembly 420 and the susceptor assembly 440 allows one or more flows of gas from the gas distribution assembly 420 to flow into the gap 470.

The susceptor assembly 440 inside the processing chamber 410. The susceptor assembly 440 has a top surface 441 and a bottom surface 443 defining a thickness T. The susceptor assembly 440 includes a plurality of recesses 442 in the top surface 441. Each of the recesses 442 has a recess bottom 446 spaced a distance from the top surface 441 of the susceptor assembly 440. At least one of the recesses 442 has a lift pocket 448 within. In some embodiments, each of the recesses 442 has a lift pocket 448. In one or more embodiments, each lift pocket 448 is substantially centered within the recess 442. As used in this regard, the term "substantially centered" means that the lift pocket 448 is within ±10 mm of being concentric with the recess 442. Each lift pocket 448 has a pocket bottom surface 449 that is spaced a distance from the recess bottom 446 and defines a depth of the lift pocket 448.

Figure 7:
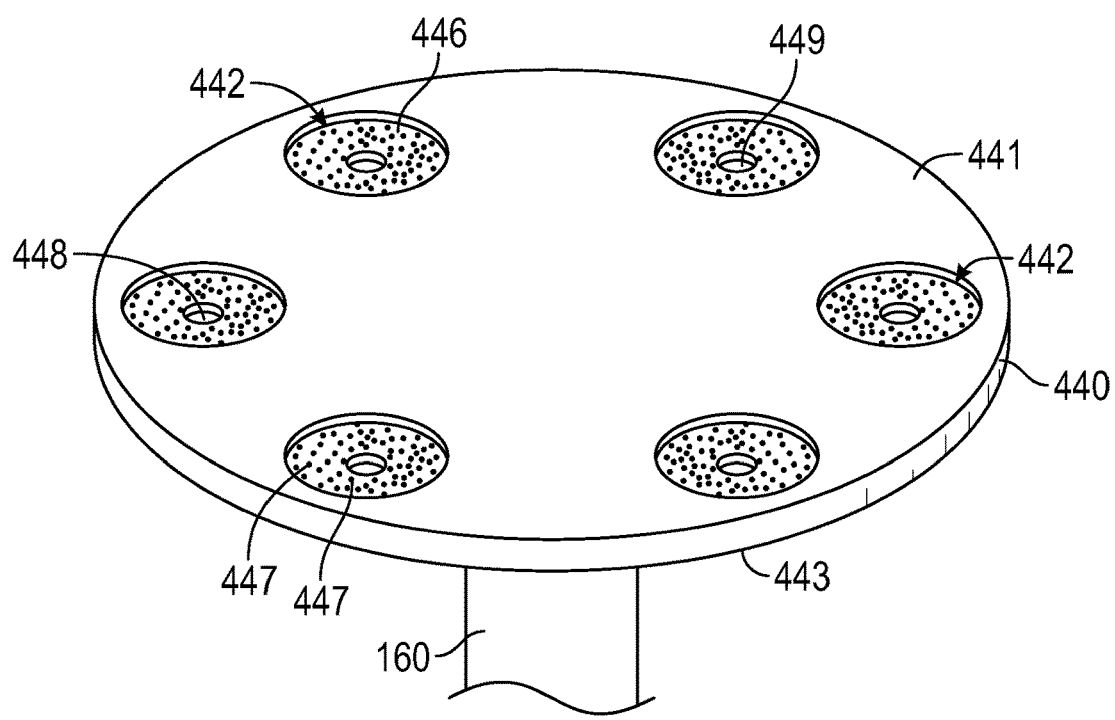
FIG. 7 shows a perspective view of a susceptor assembly in accordance with one or more embodiment of the disclosure.

The embodiment shown in FIG. 7 has recesses 442 with a flat bottom 446 that includes a plurality of apertures 447. The apertures 447 can be connected to a vacuum source (not shown) through, for example, the support post 160. The apertures 447 can be used to vacuum chuck the substrates in place during rotation of the susceptor assembly and processing. The apertures 447 can also be connected to a purge gas source (not shown) through, for example, the support post 160. The purge gas can be used as a backside purge to prevent reactions on the back of the substrate or to de-chuck the substrates after processing.

The embodiment shown in FIG. 11 has a recess 442 with a step region 521. The step region 521 provides a ledge 522 that can support the outer peripheral edge of the substrate 60 leaving a gap 523 between the back side 62 of the substrate 60 and the bottom 446 of the recess 442. While not shown, those skilled in the art will understand that a plurality of apertures 447 like that shown in FIG. 7 can be incorporated into the susceptor assembly 440 and connect to the bottom 446 of the recess 442.

Figure 8:
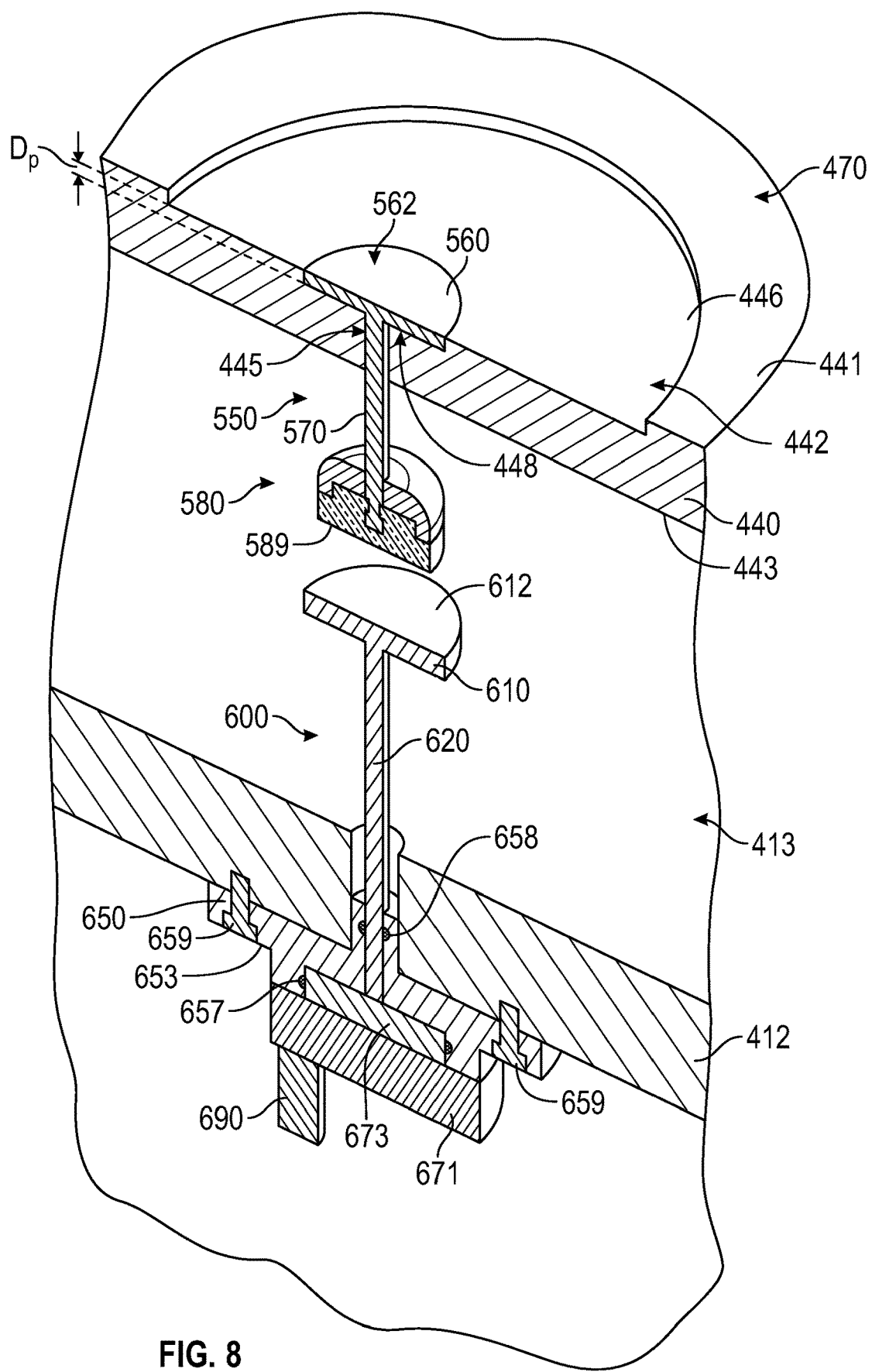
FIG. 8 shows a partial perspective view of a processing chamber in accordance with one or more embodiment of the disclosure.
Figure 9:
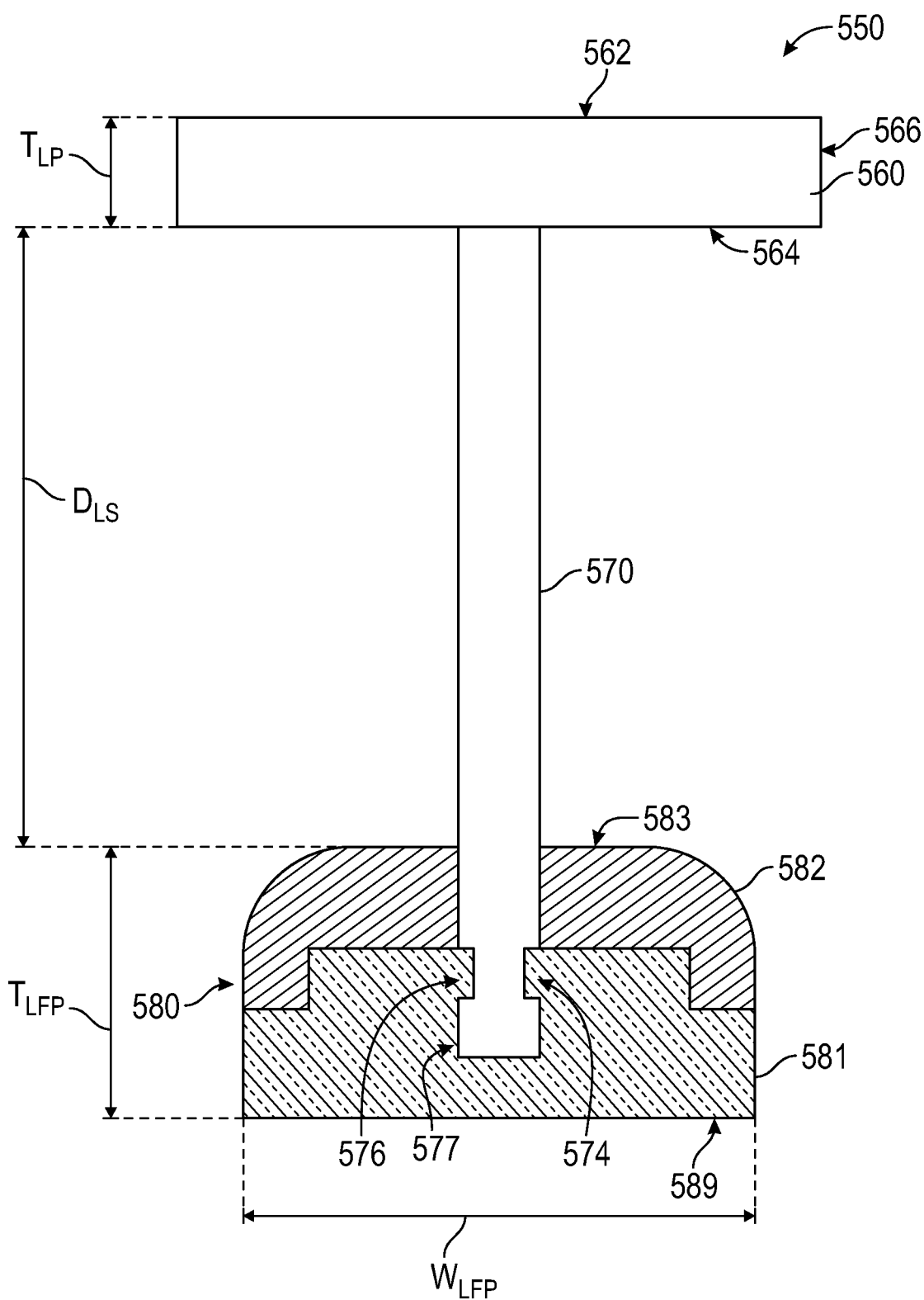
FIG. 9 shows a schematic front view of a lift assembly in accordance with one or more embodiment of the disclosure.

Referring to FIGS. 8 and 9, the apparatus includes a lift assembly 550 positioned within a lift pocket 448 in at least one of the recesses 442. The lift assembly 550 can be positioned within any number of recesses 442. In some embodiments, each recess 442 includes a lift pocket 448 and a lift assembly 550 therein.

The lift assembly 550 includes a lift plate 560 having a top surface 562, a bottom surface 564 defining a thickness $T_{LP}$. In some embodiments, the thickness $T_{LP}$ of the lift plate 560 is about the same as the depth $D_P$ of the lift pocket 448 in the susceptor assembly 440. In some embodiments, the thickness $T_{LP}$ of the lift plate 560 is within ±4 mm, 3 mm, 2 mm, 1 mm or 0.5 mm of the depth $D_P$ of the lift pocket 448.

The size of the lift plate 560 can vary depending on, for example, the size of the substrates being processed and the size of the recess 442. The lift plate 560 of some embodiments is round with an outer peripheral edge 566 with a maximum width in the range of about 20 mm to about 150 mm, or in the range of about 25 mm to about 100 mm, or in the range of about 30 mm to about 70 mm. In some embodiments, the lift plate 560 is a shape other than round and has a minimum width of greater than or equal to about 10 mm, 20 mm or 30 mm and a maximum width less than or equal to about 200 mm, 150 mm or 100 mm.

The lift assembly 550 has a lift shaft 570 connected to the lift plate 560. The lift plate 560 and lift shaft 570 can be a single piece or can be separate pieces joined together. The lift shaft 570 extends from the lift plate 560 in a direction opposite the top surface 562 of the lift plate 560. The lift shaft 570 extends a distance $D_{SS}$ from the bottom surface 564 of the lift plate 560 to a top surface 583 of a lift friction pad 580.

The lift friction pad 580 is positioned at a bottom end 574 of the lift shaft 570. The bottom end 574 of the lift shaft can be any suitable shape that can be connected to the lift friction pad 580. In the embodiment shown in FIGS. 9 and 10, the bottom end 574 of the lift shaft has an indented region or opening 576 that can lock into a complementary protrusion in the lift friction pad 580. In some embodiments, the lift friction pad 580 comprises an opening extending through a thickness $T_{LFP}$ of the lift friction pad, the opening 576 with a flared lower portion 577 sized to cooperatively interact with a complementary flared lower portion at the bottom end 574 of the lift shaft 570.

The lift friction pad 580 can be a single piece component or a multi-piece component. The embodiments shown in the Figures have two-piece lift friction pads 580. The first piece 581 and second piece 582 can be the same material or different materials.

As shown in FIG. 8, the lift plate 560 can be positioned within the lift pocket 448 formed in the recess 442 of the susceptor assembly 440. The lift shaft 570 is positioned within an opening 445 in the susceptor assembly 440 and extends a distance $D_{SS}$ (shown in FIG. 6) from the bottom surface 443 of the susceptor assembly 440. The lift shaft 570 has a length sufficient to pass through the susceptor assembly 440 and extend the lift plate 560 above the bottom 446 of the recess 442 by a distance greater than or equal to about 1 mm. In some embodiments, the length of the lift shaft 570 is sufficient to raise the lift plate 569 a distance above the bottom 446 of the recess 442 by a distance greater than or equal to about 2 mm, 3 mm, 4 mm, 5 mm, 6 mm, 7 mm, 8 mm, 9 mm or 10 mm.

The size of the lift friction pad 580 can vary and may be sized to interact with a complementary friction pad on another component. In some embodiments, the lift friction pad 580 is substantially round and has a maximum width $W_{LFP}$ in the range of about 20 mm to about 50 mm. In various embodiments, the lift friction pad 580 has a shape other than round and has a minimum width greater than or equal to about 10 mm, 20 mm or 30 mm.

Referring now to FIGS. 8, 10 and 11, some embodiments of the disclosure include a rotation assembly 600. The rotation assembly 600 can be used to apply upwardly directed force to the lift assembly 550 to lift the substrate 60 out of the recess 442. The rotation assembly 600 can also be used to rotate the substrate 60 in any number of degrees around a central axis. The central axis of the substrate 60 lies normal to the major plane of the substrate so that rotation about the axis does not significantly change the major plane of the substrate and moves a point on the outer peripheral edge of the substrate in a circular path with the axis being the center of the path.

The rotation assembly 600 includes a rotation friction pad 610 with a top surface 612. The rotation friction pad 610 has a thickness $T_{RFP}$ that can be any suitable thickness. In some embodiments, the thickness of the rotation friction pad is in the range of about 1 mm to about 50 mm, or in the range of about 2 mm to about 40 mm, or in the range of about 3 mm to about 30 mm, or in the range of about 4 mm to about 20 mm.

The width $W_{RFP}$ of the rotation friction pad 610 can be any suitable width. The width $W_{RFP}$ of the rotation friction pad 610 can vary and may be sized to interact with the lift friction pad 580. In some embodiments, the rotation friction pad 610 is substantially round and has a maximum width $W_{RFP}$ in the range of about 20 mm to about 50 mm. In various embodiments, the rotation friction pad 610 has a shape other than round and has a minimum width greater than or equal to about 10 mm, 20 mm or 30 mm In some embodiments, the top surface 612 of the rotation friction pad 610 can be vertically aligned with the bottom surface 589 of the lift friction pad 580. During rotation of the susceptor assembly 440, the one or more lift assembly 550 on the susceptor assembly 440 may rotate relative to the rotation assembly 600 so that there are times when the rotation friction pad 610 of the lift assembly 550 is in vertical alignment with the bottom surface 589 of the lift friction pad 580 of the lift assembly 550. At other times during the rotation of the susceptor assembly 440, the lift friction pad 480 and the rotation friction pad 510 may be out of vertical alignment. In some embodiments, the at least one rotation assembly 600 rotates with the susceptor assembly 440 so that the lift friction pad 480 remains in vertical alignment with the rotation friction pad 510.

A rotation shaft 620 extends from the rotation friction pad 610 in a direction opposite the top surface 612 of the rotation friction pad 610. The rotation shaft 620 has a top end 622 and a bottom end 624 defining a length $L_{RS}$. The length $L_{RS}$ of the rotation shaft 620 of some embodiments is sufficient to allow vertical movement (stroke) of the rotation assembly 600 so that the rotation shaft 620 can pass through the bottom 412 of the processing chamber 410. In some embodiments, the rotation assembly 500 is located completely within the processing chamber 410. In some embodiments, the rotation assembly 500 is located partially outside of the processing chamber 410, as shown in FIG. 8.

The stroke of the rotation shaft 620—the distance that the shaft 620 can cause the rotation friction pad 610 to move—can vary depending on; for example, size of the processing chamber 410 and the space 413 between the bottom 412 of the processing chamber 410 and the susceptor assembly 440. The apparatus of claim 11, wherein the rotation shaft has a sufficient length to allow a stroke in the range of about 10 mm to about 50 mm.

The top portion 623 of the rotation shaft 620 can be connected to the rotation friction pad 610 by any suitable means. In some embodiments, as shown in FIG. 8, the rotation shaft 620 and rotation friction pad 610 are integrally formed. Stated differently, the rotation shaft 620 and the rotation friction pad 610 are formed from a single component. The rotation friction pad 610 may have a coating or layer adjacent the top surface 612 to increase friction.

In some embodiments, as illustrated in FIGS. 10 and 11, the rotation shaft 620 is a separate component from the rotation friction pad 610. FIG. 10 shows a front view of the rotation shaft 620 and the rotation friction pad 610. FIG. 11 shows a side view of the same components as FIG. 10 illustrating one possible configuration. In this embodiment, the top portion 623 of the rotation shaft 620 has a tab 625 and the bottom portion 616 of the rotation friction pad 610 has a corresponding notch 618. Those skilled in the art will recognize that this is merely representative of one possible configuration for attaching a rotation friction pad 610 to a rotation shaft 620 and should not be taken as limiting the scope of the disclosure.

In some embodiments there is a plurality of rotation assemblies 600. Each of the rotation assemblies 600 can be in a fixed position or movable. When the rotation assemblies 600 are in a fixed position, rotation of the susceptor assembly 440 causes the lift assembly 550 to become vertically aligned with a rotation assembly 600. As used in this regard, the term "vertical alignment", and the like, mean that the top surface 612 of the rotation friction pad 610 is aligned so that vertical movement of the rotation shaft 620 causes the rotation friction pad 610 to contact the bottom surface 589 of the lift friction pad 580. The embodiment shown in FIG. 8 illustrates the vertical alignment of the rotation assembly 600 with the lift assembly 550.

In some embodiments, there are a plurality of lift assemblies 550 and a plurality of rotation assemblies 600. In some embodiments, each of the plurality of rotation assemblies 600 is in a fixed location in the processing chamber 410. During rotation of the susceptor assembly 440, each of the lift assemblies 550 moves into and out of vertical alignment with each of the rotation assemblies 600.

Referring again to FIGS. 8 and 10, some embodiments of the rotation assembly 600 include a flange 650 to allow the rotation assembly 600 to be connected to another component. The flange 650 shown includes a vertical portion 652 and a horizontal portion 654. An opening 656 in the flange 650 allows a rotation shaft 620 to pass through. The opening 656 can be sized to allow the rotation shaft 620 to moved vertically and rotate with one or more O-rings 657, 658. As shown in the Figures, O-ring 657 is positioned between the horizontal portion 654 and an adjacent component and O-ring 658 is positioned between the vertical portion 652 and an adjacent component.

The flange 650 of some embodiments includes a plurality of bolt holes 659 in a bottom surface 653 of the horizontal portion 654. The bolt holes 659 can be sized to allow the flange 650 to be bolted or connected to a surface. In the embodiment shown in FIG. 8, the rotation assembly 600 is connected to and passes through the bottom 412 of the processing chamber 410. The flange 650 is positioned adjacent to and connected to the bottom 412 of the processing chamber 410 by a plurality of bolts through bolt holes 659.

Figure 12:
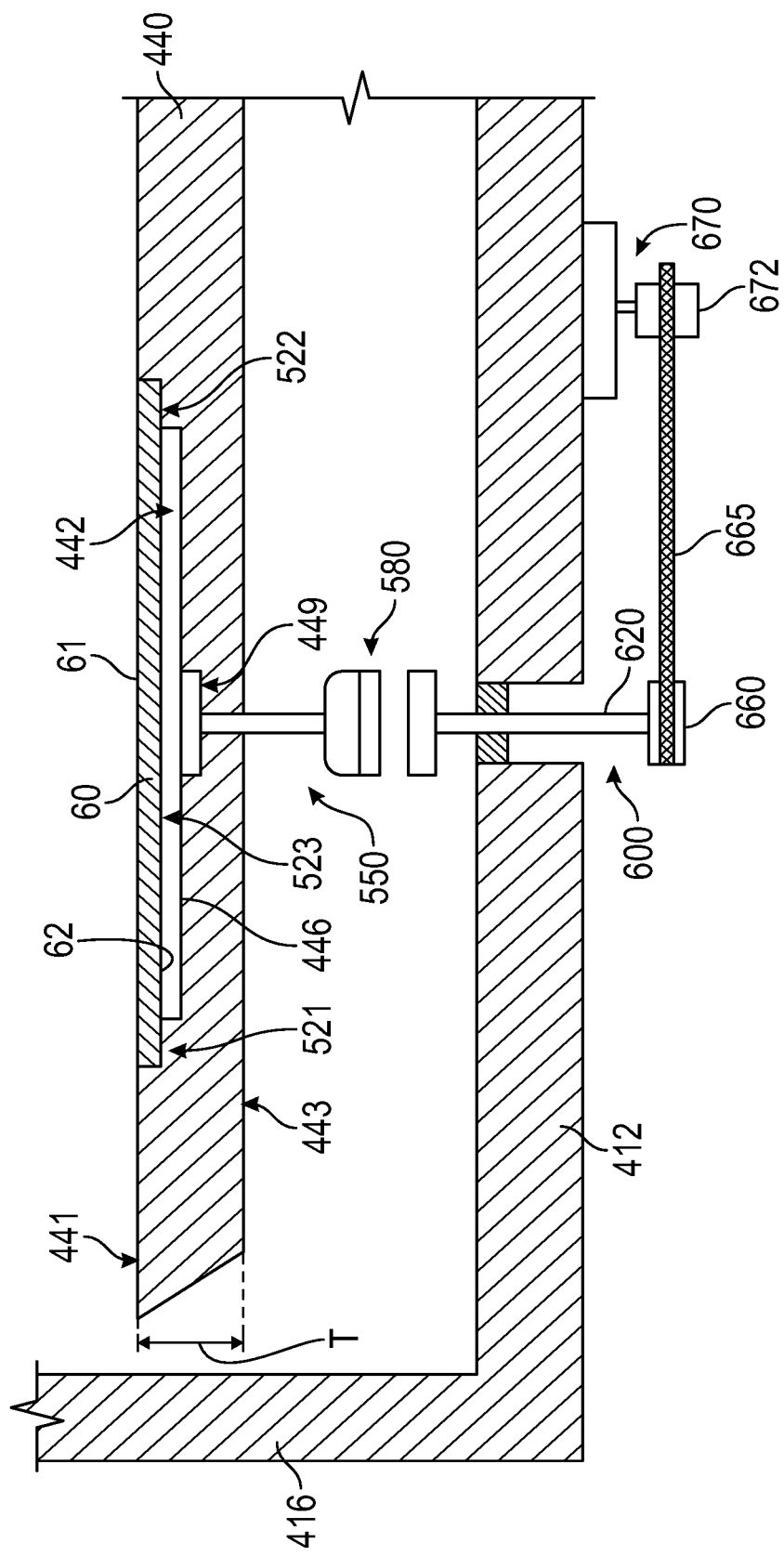
FIG. 12 shows a partial cross-sectional schematic view of a processing chamber in accordance with one or more embodiment of the disclosure.

With reference to FIGS. 10 and 12, some embodiments of the rotation assembly 600 include a pulley 660 connected to a bottom portion 621 of the rotation shaft 620. The pulley 660 can be connected to any or all of a plurality of rotation assemblies 600. The pulley 660 of FIG. 10 has a groove 662 which can be used to provide vertical support for a belt 665 (see FIG. 12) that can be connected to a motor to rotate the rotation shaft 620.

FIG. 12 shows an embodiment in which there is a rotation motor 670 with a rotation motor pulley 672 and a belt 665 sized to contact the pulley 660 on the rotation assembly 600. In some embodiments, each rotation assembly 600 has a separate rotation motor 670 that can be a belt driven or a direct drive motor (see FIG. 8). In some embodiments, each rotation assembly 600 has a separate rotation motor 670 with a belt 665 connected thereto so that each rotation assembly 600 can be rotated independently of any other rotation assembly 600.

Figure 13:
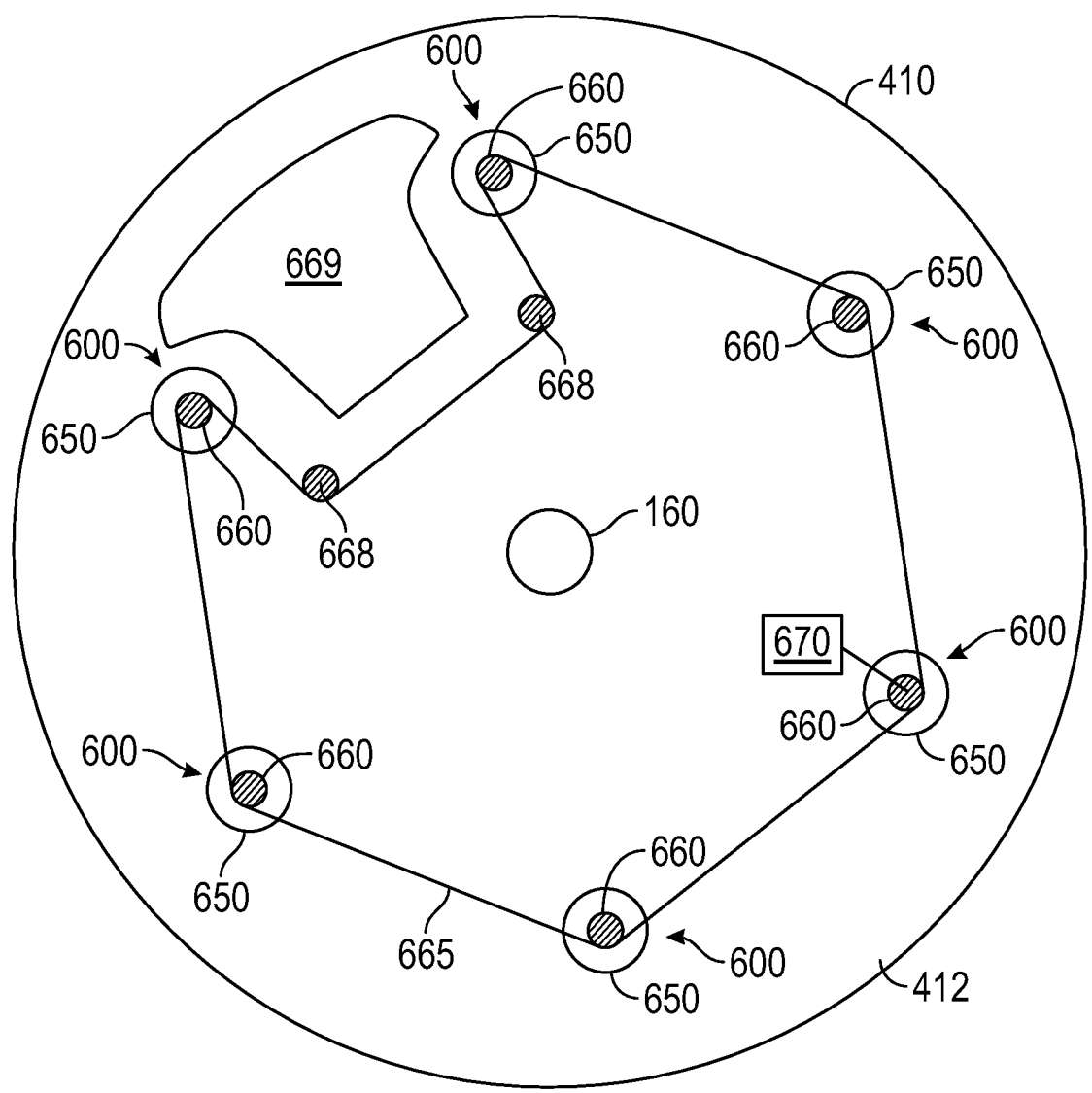
FIG. 13 shows a bottom schematic view of a susceptor assembly in accordance with one or more embodiment of the disclosure.

FIG. 13 shows a view of the bottom 412 processing chamber 410 in which there are a plurality of rotation assemblies 600. The flange 650 and pulley 660 of each of the rotation assemblies 600 are arranged around the processing chamber 410. Each of the rotation assemblies 600 are connected to a single rotation motor 670 so that all of the rotation assemblies 600 are rotated at the same time. In one or more embodiments, there are in the range of about 2 to about 12 rotation assemblies, or in the range of about 4 to about 8 rotation assemblies. In some embodiments, there are six rotation assemblies 600 with each rotation shaft having a pulley 660 connected thereto and each pulley 660 connected by a single belt 665 to allow simultaneous rotation of the rotation shafts 620. In some embodiments, one rotation motor 670 has a belt 665 sized to contact the pulley 660 on each of the rotation assemblies 600 so that all of the rotation assemblies 600 are rotated at the same time. In the embodiment shown in FIG. 13, additional pulleys 668 are positioned on the bottom 412 of the susceptor assembly 440, or on an enlarged flange (not shown), so that the belt 665 can be routed around additional components 669 which may be present (e.g., a lift pin motor).

Referring back to FIG. 8, some embodiments have a rotation assembly 600 that further comprises a direct drive rotation motor 671 in contact with and configured to rotate the rotation shaft 620. The direct drive rotation motor 671 does not use a belt 665 or pulley 660 and connects directly to, or through a flange 673, to the rotation shaft 620.

In some embodiments, a z-axis motor 690 is configured to move the rotation assembly 600 vertically. As shown in FIG. 8, the direct drive rotation motor 671 and z-axis motor 690 can be coupled together so that the combination of motors allows up and down movement of the rotation shaft 620 and rotation of the rotation shaft 620. In some embodiments, there are six rotation assemblies 600 and six lift assemblies 550 and each of the rotation assemblies has a separate direct drive rotation motor 671 and a z-axis motor 690.

Figure 14A:
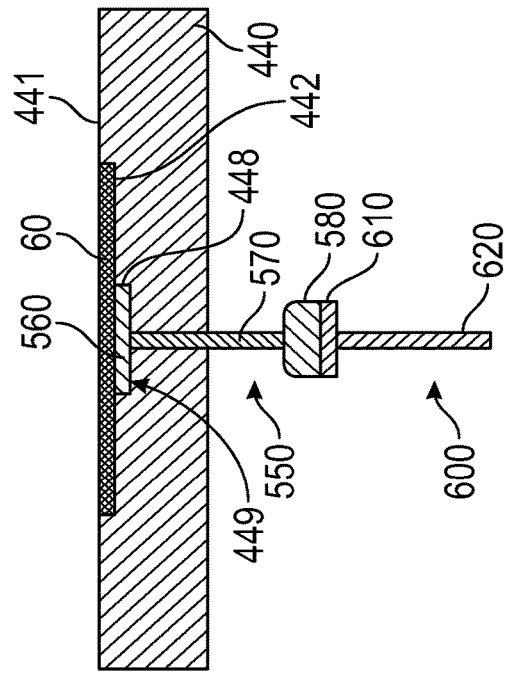
FIGS. 14A through 14C show a partial cross-sectional schematic of a processing chamber and processing method in accordance with one or more embodiment of the disclosure.
Figure 14B:
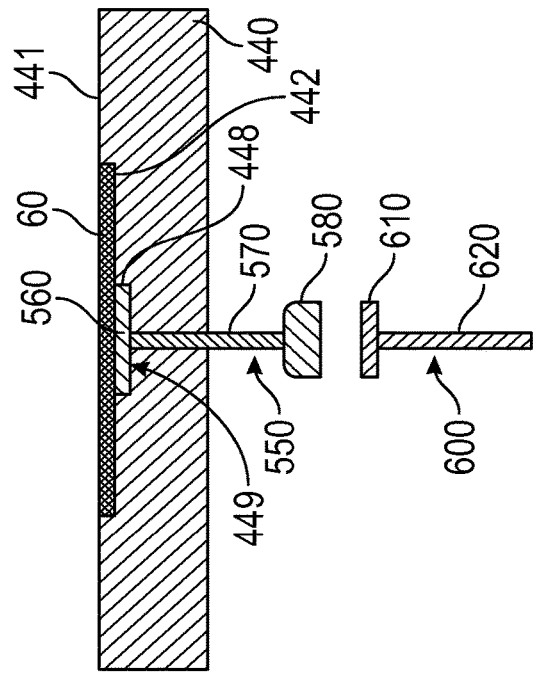
Figure 14C:
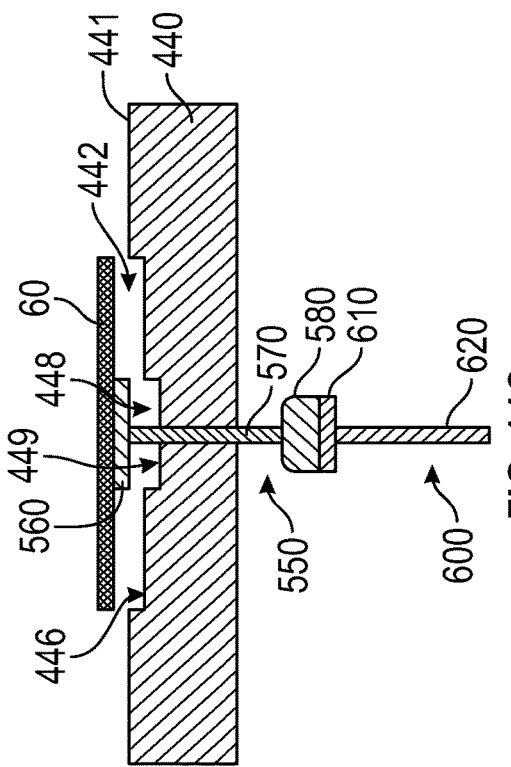

Referring to FIGS. 14A through 14C, some embodiments of the disclosure are directed to processing methods. A plurality of substrates 60 are positioned on a susceptor assembly 440 that includes a plurality of recesses 442 in a top surface 441 thereof. For ease of description, FIGS. 14A through 14C show a single substrate 60 in a single recess 442 on the susceptor assembly 440. However, those skilled in the art will understand that there can be any number of substrates 60 in any number of recesses 442 and this should not be taken as limiting the scope of the disclosure.

Each of the recesses 442 in the susceptor assembly 440 has a lift pocket 448 formed therein. A lift assembly 550 is positioned within the lift pocket 448 so that a lift plate 560 rests within the lift pocket 448 and a lift shaft 570 passes through the susceptor assembly 440. In the position shown in FIG. 14A, the lift assembly 550 is in the lowest position so that the lift plate 560 is resting against the pocket bottom surface 449 of the lift pocket 448. The lift friction pad 580 is not in contact with and is spaced a distance from the rotation friction pad 610.

The substrates 60 can be processed by exposing at least some of the substrates 60 to a flow of reactive gas from a gas distribution assembly 420 (see FIG. 6) positioned above and spaced from the top surface 441 of the susceptor assembly 440. During processing, the susceptor assembly 440 may be rotated to expose at least some of the substrates 60 to the flow of reactive gases. Rotation of the susceptor assembly 440 is stopped.

The distance between the lift assembly 550 within the recess 442 and the rotation assembly 600 can be decreased until the lift friction pad 580 contacts the rotation friction pad 610. The distance between the lift assembly 550 and the rotation assembly 600 can be decreased by, for example, lowering the susceptor assembly 440 with the support post 160, or raising the height of the rotation assembly 600 with a z-axis motor (see FIG. 8).

Once the lift friction pad 580 and the rotation friction pad 610 are in contact, continued movement of either the z-axis motor or the support post 160 will cause upwardly directed force to be applied to the lift friction pad 580. The upwardly directed force pushes the lift shaft 570 and lift plate 560 upward so that the lift plate 560 is no longer in contact with the pocket bottom surface 449 and the substrate 60 is raised above the recess bottom 446. All of the substrates 60 can be lifted at the same time, or some of the substrates can remain within the recess 442. Raising the substrates from the recess can be done by either raising the lift assembly 550 or by lowering the susceptor assembly 440. Either process results in the substrates being elevated above the recess bottom 446.

The substrates 60 can be rotated by turning the rotation shaft 620. The rotation shaft can be turned by use of a belt-drive motor with a pulley or by a direct drive motor as described above. Those skilled in the art will understand that there are other ways to rotate the rotation shaft 620 and that the disclosure is not limited to belt-driven motors and direct drive motors. All of the substrates 60 can be rotated, or some of the substrates can be rotated and others not rotated.

Rotating the rotation shaft 620 causes rotation of the rotation friction pad 610. Contact of between the rotation friction pad 610 and the lift friction pad 580 causes the lift friction pad 580, the lift shaft 570, the lift plate 560 and the substrate 60 to be rotated. The amount of rotation can be varied from less than 1° to 359°. In some embodiments, the amount of rotation of the substrates is in the range of about 10° to about 350°, or in the range of about 20° to about 340°, or in the range of about 30° to about 330°, or in the range of about 40° to about 320°, or in the range of about 50° to about 310°, or in the range of about 60° to about 300°, or in the range of about 70° to about 290°, or in the range of about 80° to about 280°, or in the range of about 90° to about 270°, or in the range of about 100° to about 260°, or in the range of about 110° to about 250°, or in the range of about 120° to about 240°, or in the range of about 130° to about 230°, or in the range of about 140° to about 220°, or in the range of about 150° to about 210°, or in the range of about 160° to about 200°, or in the range of about 170° to about 190°. In some embodiments, the substrates are rotated by an amount in the range of about 40° to about 50°, or in the range of about 85° to about 95°, or in the range of about 130° to about 140°, or in the range of about 175° to about 185°.

After the substrates 60 have been rotated, the substrates 60 are then lowered into the recesses 442 on the susceptor assembly 440. In some embodiments, the susceptor assembly 440 is raised so that the substrates 60 are positioned in the recesses 442. Lowering the substrates into the recesses can be done by either lowering the lift assembly 550 or by raising the susceptor assembly 440. Both processes result in the substrate moving to contact the recess bottom 446 of the recesses 442.

According to one or more embodiments, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, annealing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, anneal, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

In atomic layer deposition type chambers, the substrate can be exposed to the first and second precursors either spatially or temporally separated processes. Temporal ALD is a traditional process in which the first precursor flows into the chamber to react with the surface. The first precursor is purged from the chamber before flowing the second precursor. In spatial ALD, both the first and second precursors are simultaneously flowed to the chamber but are separated spatially so that there is a region between the flows that prevents mixing of the precursors. In spatial ALD, the substrate is moved relative to the gas distribution plate, or vice-versa.

In embodiments, where one or more of the parts of the methods takes place in one chamber, the process may be a spatial ALD process. Although one or more of the chemistries described above may not be compatible (i.e., result in reaction other than on the substrate surface and/or deposit on the chamber), spatial separation ensures that the reagents are not exposed to each in the gas phase. For example, temporal ALD involves the purging the deposition chamber. However, in practice it is sometimes not possible to purge the excess reagent out of the chamber before flowing in additional regent. Therefore, any leftover reagent in the chamber may react. With spatial separation, excess reagent does not need to be purged, and cross-contamination is limited. Furthermore, a lot of time can be used to purge a chamber, and therefore throughput can be increased by eliminating the purge step.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A processing method comprising:

positioning a plurality of substrates on a susceptor assembly inside a processing chamber, each of the substrates positioned within a recess in a top surface of the susceptor assembly, the recess having a recess bottom spaced a distance from the top surface of the susceptor assembly, each of the recesses having a lift pocket with a lift pocket bottom surface spaced a distance from the recess bottom defining a depth of the lift pocket;

exposing at least some of the substrates to a flow of reactive gas from a gas distribution assembly positioned above and spaced from the top surface of the susceptor assembly;

rotating the susceptor assembly while exposing at least some of the substrates to the flow of reactive gas;

stopping rotation of the susceptor assembly;

raising the substrates by lowering the susceptor assembly until a lift assembly within the recess contacts a rotation assembly below the susceptor assembly and causes the substrates to be lifted from the recess, the lift assembly comprising a lift plate having a top surface and bottom surface defining a thickness, a lift shaft extending from the lift plate opposite the top surface and a lift friction pad with a bottom surface at an end of the lift shaft, the lift plate positioned within the lift pocket and the lift shaft positioned within an opening in the susceptor assembly, wherein, when the lift assembly is in a lowest position, the lift plate is resting against the lift pocket bottom surface and the lift friction pad is not in contact with and is spaced a distance from the rotation friction pad, the rotation assembly comprising a rotation friction pad with a top surface and a rotation shaft extending from the rotation friction pad, the top surface of the rotation friction pad in vertical alignment with the bottom surface of the lift friction pad, the rotation assembly having a pulley connected to the rotation shaft;

rotating the substrates by turning the rotation shaft with a rotation motor connected to the pulley on the rotation shaft with a belt to rotate the rotation friction pad which contact with the lift friction pad causes rotation of the lift friction pad, the lift shaft and the lift plate which contacts the substrates causing rotation of the substrates; and lowering the substrates into the recess by raising the susceptor assembly to disengage the lift assembly from the rotation assembly.

2. The processing method of claim 1, wherein the thickness of the lift plate is within ±2 mm of the depth of the lift pocket.

3. The processing method of claim 1, wherein the lift pocket is substantially centered in the recess.

4. The processing method of claim 1, wherein the lift friction pad comprises an opening extending through a thickness of the lift friction pad, the opening having a flared lower portion sized to cooperatively interact with a complementary flared lower portion of the lift shaft.

5. The processing method of claim 1, wherein the lift shaft has a length sufficient to pass through the susceptor and extend the lift plate above the bottom surface of the recess by a distance greater than or equal to about 1 mm.

6. The processing method of claim 1, wherein the lift friction pad has a maximum width in the range of about 20 mm to about 50 mm.

7. The processing method of claim 1, wherein each recess has a lift assembly.

8. The processing method of claim 1, wherein the rotation friction pad has a maximum width in the range of about 20 mm to about 50 mm.

9. The processing method of claim 1, wherein the rotation assembly further comprises a flange having an opening sized to allow the rotation shaft to pass through and a bottom surface with a plurality of bolt holes therethrough to allow the flange to be bolted to a surface.

10. The processing method of claim 1, wherein the rotation shaft has a length sufficient to pass through a bottom of a processing chamber and allow sufficient vertical movement to contact the lift friction pad and move the lift friction pad vertically.

11. The processing method of claim 10, wherein the rotation shaft has a sufficient length to allow a stroke in the range of about 10 mm to about 50 mm.

12. The processing method of claim 1, further comprising a rotation motor having a belt connected to the pulley of the rotation assembly.

13. The processing method of claim 12, wherein there are six rotation assemblies, with each rotation shaft having a pulley connected thereto.

14. The processing method of claim 13, wherein each rotation assembly has a separate rotation motor with a belt connected thereto so that each rotation assembly can be rotated independently of any other rotation assembly.

15. The processing method of claim 13, wherein there is one rotation motor with a belt sized to contact the pulley on each of the rotation assemblies so that all of the rotation assemblies are rotated at the same time.

16. The processing method of claim 1, wherein the rotation assembly further comprises a direct drive rotation motor in contact with and configured to rotate the rotation shaft and a z-axis motor configured to move the rotation assembly vertically.

* * * * *